US012628269B2

(12) United States Patent
Shinada

(10) Patent No.: US 12,628,269 B2
(45) Date of Patent: May 12, 2026

(54) FLEXIBLE PRINTED BOARD

(71) Applicant: Mitsubishi Electric Corporation, Tokyo (JP)

(72) Inventor: Takuro Shinada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 247 days.

(21) Appl. No.: 18/548,216

(22) PCT Filed: Jun. 9, 2021

(86) PCT No.: PCT/JP2021/021927
§ 371 (c)(1),
(2) Date: Aug. 28, 2023

(87) PCT Pub. No.: WO2022/259425
PCT Pub. Date: Dec. 15, 2022

(65) Prior Publication Data
US 2024/0121891 A1      Apr. 11, 2024

(51) Int. Cl.
H05K 1/02          (2006.01)
(52) U.S. Cl.
CPC ... H05K 1/0281 (2013.01); H05K 2201/2009 (2013.01)
(58) Field of Classification Search
CPC ..................... H05K 2201/2009; H05K 1/0281
See application file for complete search history.

(56) References Cited

U.S. PATENT DOCUMENTS

| | | | |
|---|---|---|---|
| 2009/0014204 A1* | 1/2009 | Wang | H05K 1/118 174/254 |
| 2011/0278047 A1 | 11/2011 | Yamauchi et al. | |
| 2012/0205138 A1* | 8/2012 | Kim | H01R 43/28 174/117 F |
| 2018/0324943 A1* | 11/2018 | Fukuda | H05K 1/147 |

FOREIGN PATENT DOCUMENTS

| | | |
|---|---|---|
| JP | S63-36075 U | 3/1988 |
| JP | H09-64489 A | 3/1997 |
| JP | 2005-183464 A | 7/2005 |
| JP | 2005-311106 A | 11/2005 |
| JP | 2011-238883 A | 11/2011 |
| WO | 2019/043933 A1 | 3/2019 |

OTHER PUBLICATIONS

International Search Report issued in PCT/JP2021/021927; mailed Aug. 24, 2021.

* cited by examiner

*Primary Examiner* — Jeremy C Norris
(74) *Attorney, Agent, or Firm* — Studebaker Brackett PLLC

(57)          ABSTRACT
A flexible printed board according to the present disclosure includes a first pattern layer including, at an end part thereof, a wiring end part to be connected to a substrate and a resist and a coverlay overlaid on the first pattern layer, wherein the coverlay covers an inside of the wiring end part of the first pattern layer in a planar view, and the resist is provided from a portion of the first pattern layer covered with the coverlay to a portion of the first pattern layer exposed from the coverlay, in a planar view.

9 Claims, 22 Drawing Sheets

FRONT END ◄────── ROOT

200

FRONT END ◄───────── ROOT

FLEXIBLE PRINTED BOARD

FIELD

The present disclosure relates to a flexible printed board.

BACKGROUND

PTL 1 discloses a flexible printed circuit board. The flexible printed circuit board includes a substrate having a first edge and a second edge. A first wiring pattern and a second wiring pattern are disposed on the substrate. A first brazing material pattern is disposed on a lead connection portion of the first wiring pattern positioned at a side of the first edge of the substrate. A second brazing material pattern that extends longer than the first brazing material pattern is disposed on a lead connection portion of the second wiring pattern positioned at a side of the first edge of the substrate. As a result, when the flexible printed circuit board is bent, stress is distributed. This makes it possible to prevent disconnection of the wiring patterns.

CITATION LIST

Patent Literature

[PTL 1] JP 2011-238883 A

SUMMARY

Technical Problem

When a flexible printed board is bent, stress is generally likely to concentrate on a root portion of the flexible printed board. Therefore, disconnection may occur. In PTL 1, stress is distributed by providing the long second brazing material pattern at the edge. However, providing the long second brazing material pattern may inhibit reduction in length of the flexible printed board.

An object of the present disclosure is to provide a flexible printed board that can be reduced in length while preventing disconnection.

Solution to Problem

A flexible printed board according to the present disclosure includes a first pattern layer including, at an end part thereof, a wiring end part to be connected to a substrate and a resist and a coverlay overlaid on the first pattern layer, wherein the coverlay covers an inside of the wiring end part of the first pattern layer in a planar view, and the resist is provided from a portion of the first pattern layer covered with the coverlay to a portion of the first pattern layer exposed from the coverlay, in a planar view.

Advantageous Effects of Invention

In the flexible printed board according to the present disclosure, the resist is provided at the portion of the first pattern layer corresponding to the end part of the coverlay where stress is likely to concentrate. This makes it possible to prevent disconnection. Further, it is unnecessary to provide a long pattern at the end part of the substrate in order to distribute stress. Accordingly, the flexible printed board can be reduced in length.

BRIEF DESCRIPTION OF DRAWINGS

FIG. 14 is a diagram to explain portions as boundaries of the members of the flexible printed board according to embodiment 1.

FIG. 26 is a diagram to explain a structure of a flexible printed board according to Embodiment 5.

DESCRIPTION OF EMBODIMENTS

Figure 1:
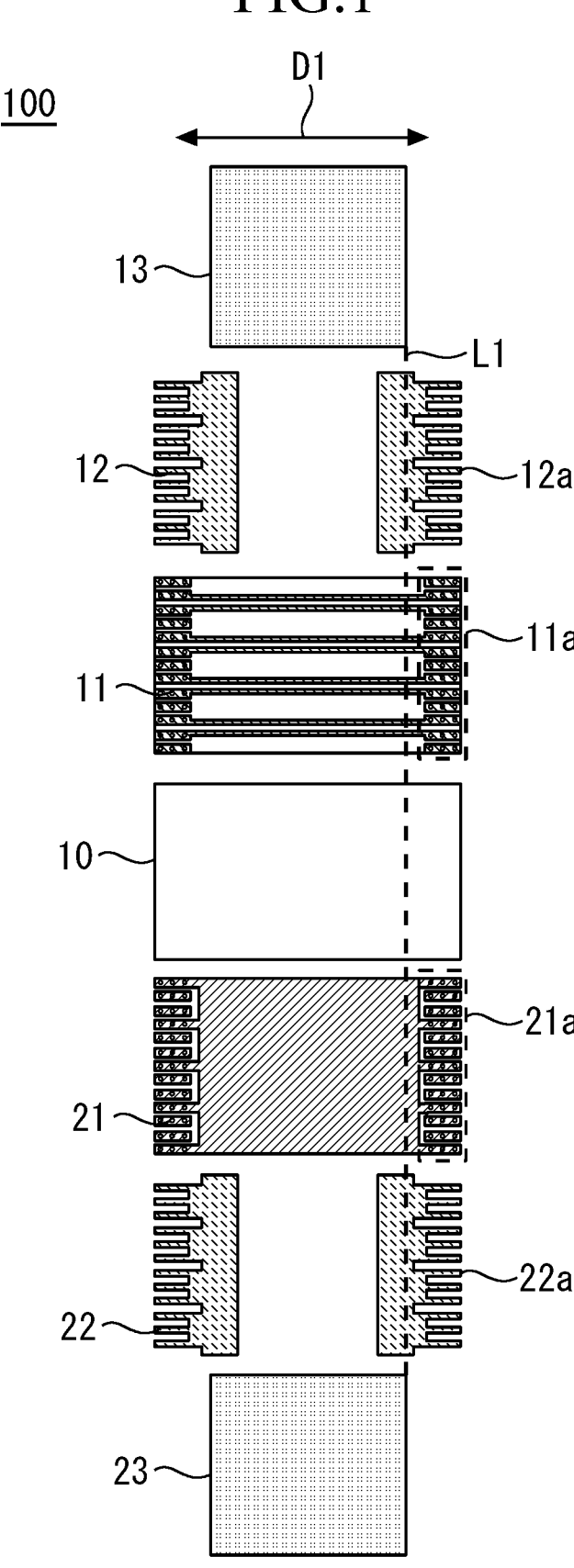
FIG. 1 is a diagram to explain a structure of a flexible printed board according to Embodiment 1.

A flexible printed board according to each of embodiments is described with reference to drawings. The same or corresponding components are denoted by the same reference numerals, and repetitive description is omitted in some cases. In the following description, terms indicating specific positions and directions such as "upper", "lower", "front", "rear", "left", "right", and "side" are used in some cases. These terms are used for convenience in order to facilitate understanding of contents of the embodiments, and do not limit positions and directions in implementation.

Embodiment 1

Figure 2:
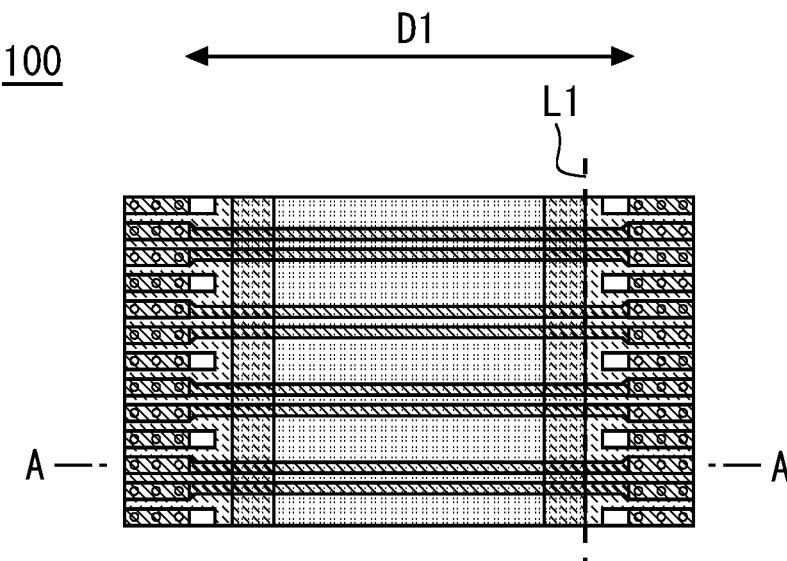
FIG. 2 is a plan view of the flexible printed board according to Embodiment 1.
Figure 3:
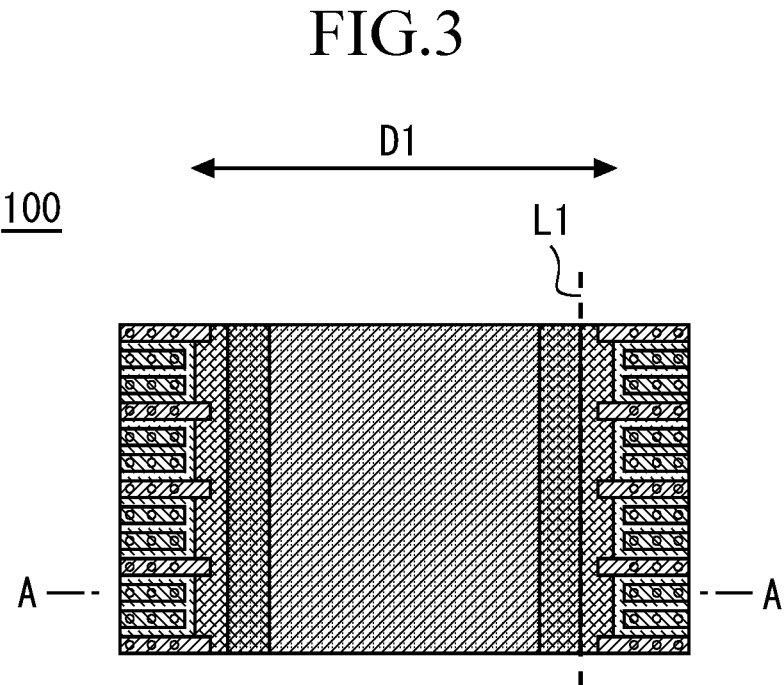
FIG. 3 is a bottom view of the flexible printed board according to Embodiment 1.
Figure 4:
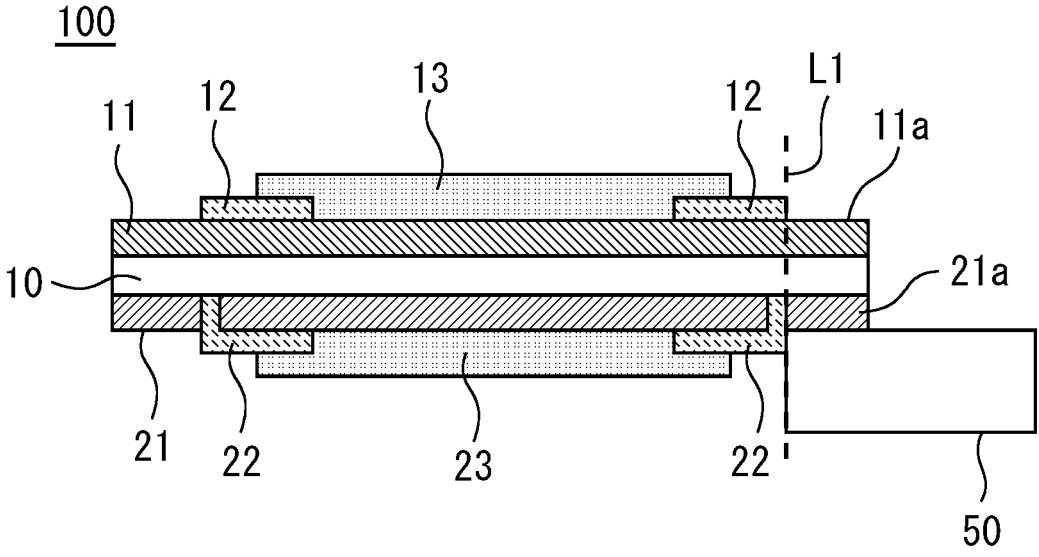
FIG. 4 is a cross-sectional view of the flexible printed board according to Embodiment 1.

FIG. 1 is a diagram to explain a structure of a flexible printed board 100 according to Embodiment 1. FIG. 2 is a plan view of the flexible printed board 100 according to Embodiment 1. FIG. 3 is a bottom view of the flexible printed board 100 according to Embodiment 1. FIG. 4 is a cross-sectional view of the flexible printed board 100 according to Embodiment 1. FIG. 4 is a cross-sectional view taken along line A-A in FIG. 2. The flexible printed board 100 includes a base 10, pattern layers 11 and 21, resists 12 and 22, and coverlays 13 and 23.

The pattern layer 21 is provided on a first surface of the base 10. The pattern layer 11 is provided on a second surface on a side opposite to the first surface of the base 10. The pattern layer 11 includes a wiring end part 11a at an end part thereof. The pattern layer 21 includes a wiring end part 21a at an end part thereof. The wiring end part 21a is to be connected to a substrate 50. The resist 12 and the coverlay 13 are overlaid on the pattern layer 11. The resist 22 and the coverlay 23 are overlaid below the pattern layer 21.

The coverlay 13 covers an inside of the wiring end part 11a of the pattern layer 11 in a planar view. Likewise, the coverlay 23 covers an inside of the wiring end part 21a of the pattern layer 21 in a planar view. The inside is a center portion side in a signal propagation direction D1.

In a planar view, the resist 12 is provided from a portion of the pattern layer 11 covered with the coverlay 13 to a portion of the pattern layer 11 exposed from the coverlay 13. Likewise, in a planar view, the resist 22 is provided from a portion of the pattern layer 21 covered with the coverlay 23 to a portion of the pattern layer 21 exposed from the coverlay 23.

A thickness of the base 10 is, for example, 50 μm. The pattern layer may be provided on one of the first surface and the second surface of the base 10. The pattern layers 11 and 21 are formed in the following manner. First, metal films are bonded to the entire first surface and the entire second surface of the base 10. Each of the metal films is, for example, a rolled copper foil having a thickness of 20 μm. Next, portions other than signal lines are removed from the metal films by etching or the like. As a result, the signal lines are formed on the first surface and the second surface of the base 10. Further, the signal lines are covered with, for example, copper or gold having a thickness of 10 μm by electroplating or the like. The pattern layer 11 and the pattern layer 21 are electrically conductive through vias and the like.

Each of the base 10 and the coverlays 13 and 23 is made of a dielectric material such as polyimide. The coverlays 13 and 23 are bonded and fixed to the base 10 provided with the pattern layers 11 and 21, with an adhesive or the like. The coverlays 13 and 23 are provided to protect the signal lines.

Each of the resists 12 and 22 is made of, for example, a photosensitive resin. The resists 12 and 22 are provided to protect the signal lines. In a planar view, a center portion of the pattern layer 11 in the signal propagation direction D1 is exposed from the resist 12. Likewise, in a planar view, a center portion of the pattern layer 21 in the signal propagation direction D1 is exposed from the resist 22.

As illustrated in FIG. 1, each of the wiring end parts 11a and 21a includes a plurality of patterns. The end part 12a of the resist 12 is provided between the plurality of patterns of the wiring end part 11a. Likewise, the end part 22a of the resist 22 is provided between the plurality of patterns of the wiring end part 21a. The resists 12 and 22 are formed on the base 10 by a method such as printing so as to avoid the plurality of patterns of the wiring end parts 11a and 21a. The resists 12 and 22 are formed by a method such as printing so as to respectively cover the pattern layers 11 and 21 at portions other than the wiring end parts 11a and 21a.

In FIG. 4, the substrate 50 is, for example, a ceramic substrate to be mounted on an optical module product. The substrate 50 may be a transmission substrate to be mounted on an optical transceiver product or the like. The flexible printed board 100 is mounted on the substrate 50 through the wiring end part 21a. The wiring end part 21a and the substrate 50 are joined with a joining material such as a solder material or a conductive film.

In FIG. 1, the pattern layer 11, the resist 12, and the coverlay 13 are overlaid in this order; however, the pattern layer 11, the coverlay 13, and the resist 12 may be overlaid in this order. Likewise, in FIG. 1, the pattern layer 21, the resist 22, and the coverlay 23 are overlaid in this order; however, the pattern layer 21, the coverlay 23, and the resist 22 may be overlaid in this order.

Figure 5:
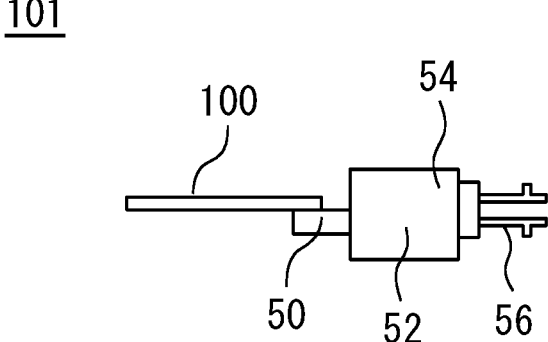
FIG. 5 is a diagram illustrating a state where the flexible printed board according to Embodiment 1 is connected to the substrate.
Figure 6:
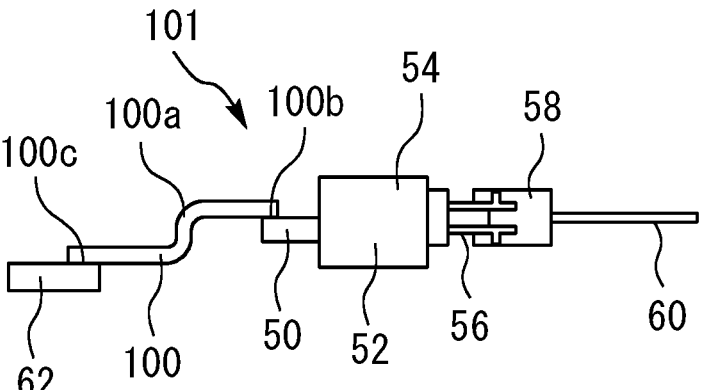
FIG. 6 is a diagram illustrating a state where the flexible printed board according to Embodiment 1 is connected to a transmission substrate.

The flexible printed board 100 is used for, for example, an optical communication module. FIG. 5 is a diagram illustrating a state where the flexible printed board 100 according to Embodiment 1 is connected to the substrate 50. FIG. 6 is a diagram illustrating a state where the flexible printed board 100 according to Embodiment 1 is connected to a transmission substrate 62. An optical communication module 101 includes a package 52 made of a metal or the like. The package 52 incorporates an optical communication device 54. The substrate 50 is joined to the package 52 with solder or the like. For example, the substrate 50 is a package ceramic substrate including a transmission line transmitting an electric signal. The substrate 50 and the flexible printed board 100 are joined with a conductive material such as solder. The package 52 and a receptacle 56 are joined by welding or the like. The receptacle 56 transmits an optical signal to an optical fiber 60 through an optical connector 58.

Generally, in a case where substrates are connected to each other, a flexible printed board is often used. In particular, when an optical module product is mounted on an optical transceiver, the flexible printed board is often used to connect a transmission substrate of the optical transceiver and a package ceramic substrate. At this time, as illustrated in FIG. 6, the flexible printed board 100 deforms at, for example, a deformation portion 100a. End parts 100b and 100c of the flexible printed board 100 are respectively electrically connected to the substrate 50 and the transmission substrate 62.

Figure 7:
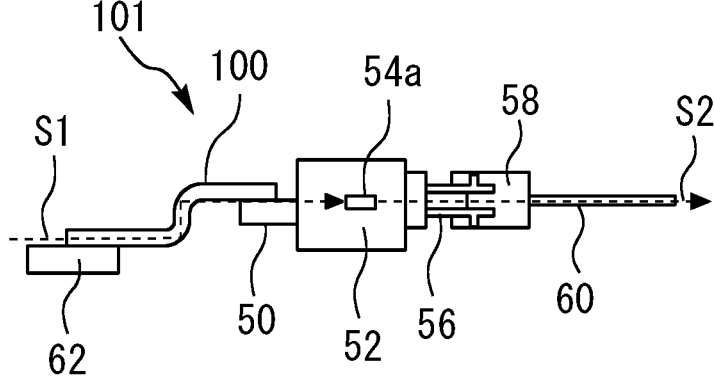
FIG. 7 is a diagram illustrating a state where the flexible printed board according to Embodiment 1 is connected to an LD module.

FIG. 7 is a diagram illustrating a state where the flexible printed board 100 according to Embodiment 1 is connected to an LD (Laser Diode) module. In this case, a laser diode Ma is mounted on the optical communication module 101.

An electric signal S1 input from the optical transceiver through the flexible printed board 100 is converted into an optical signal S2 by the laser diode Ma. When the laser diode Ma is connected to the optical fiber 60 through the optical connector 58, the optical signal S2 is transmitted to the optical fiber 60.

Figure 8:
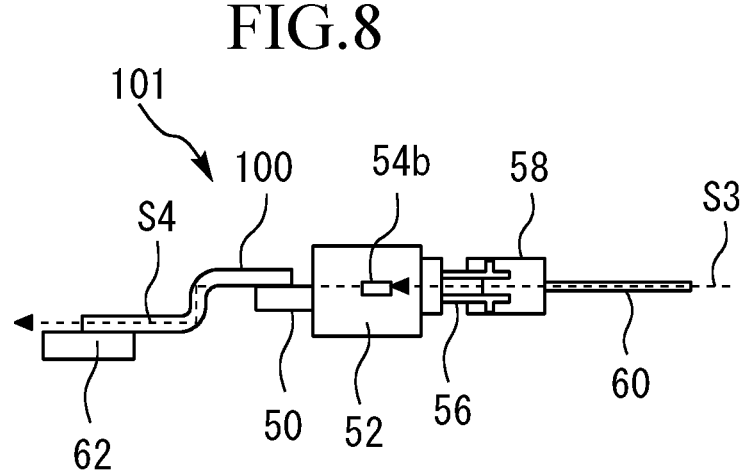
FIG. 8 is a diagram illustrating a state where the flexible printed board according to Embodiment 1 is connected to a PD module.

FIG. 8 is a diagram illustrating a state where the flexible printed board 100 according to Embodiment 1 is connected to a PD (Photo Diode) module. In this case, a photodiode 54*b* is mounted on the optical communication module 101. An optical signal S3 input from the optical fiber 60 through the optical connector 58 is converted into an electric signal S4 by the photodiode. The electric signal S4 is output to the transmission substrate 62 through the flexible printed board 100. As described above, the optical communication module 101 converts the electric signal and the optical signal.

Each of the transmission substrate, the optical communication module, and the optical connector generally has manufacturing variation. Therefore, it is anticipated that the electric signal cannot be transmitted normally due to variation in positional relationship between the transmission substrate and the substrate of the optical communication module. Therefore, using the flexible printed board 100 according to the present embodiment makes it possible to transmit the electric signal and to adjust a connection position of the electric signal. In other words, deformation of the flexible printed board 100 makes it possible to absorb positional variation between the transmission substrate 62 and the substrate 50. This makes it possible to normally transmit the electric signal from the optical transceiver to the optical communication module 101.

Figure 9:
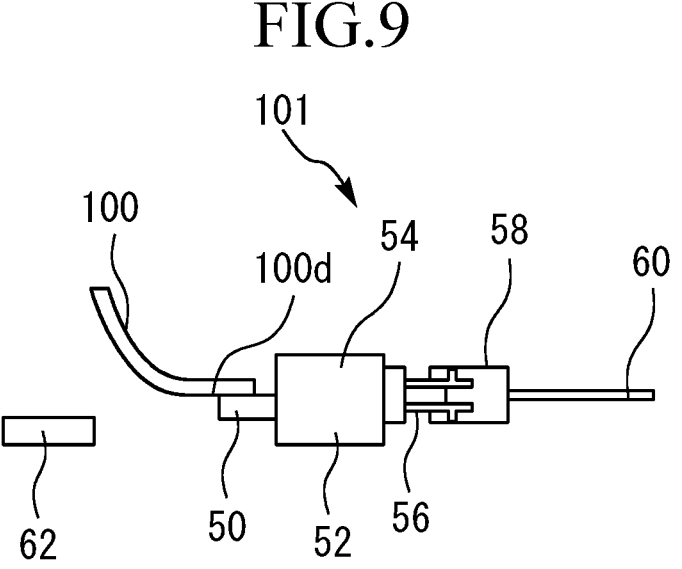
FIG. 9 is a diagram illustrating a state where the flexible printed board according to Embodiment 1 is bent.

FIG. 9 is a diagram illustrating a state where the flexible printed board 100 according to Embodiment 1 is bent. The flexible printed board 100 connected to the optical communication module 101 is generally bent for positional adjustment. When the flexible printed board 100 is bent, stress is likely to concentrate on a root portion 100*d* of the flexible printed board 100 near the substrate 50. The stress is stress, for example, in a direction in which the flexible printed board 100 is peeled off from the substrate 50. If disconnection occurs on the flexible printed board due to such stress, a function of transmitting the electric signal may be impaired. As a result, the optical communication module may not fulfill the function.

To prevent disconnection at bending, a coverlay to protect wirings is generally provided at a portion other than the wiring end part on the flexible printed board in some cases. In this configuration, the portion covered with the coverlay is bent. Further, a resist is used in place of the coverlay in some cases.

In a case where the coverlay is used, stress is likely to concentrate on a boundary portion between the coverlay and the wiring end part. Further, the coverlay is excellent in bendability but is generally low in bonding accuracy. Therefore, to prevent interference between the wiring end part and the coverlay, it is necessary to secure a wide gap between the wiring end part and the coverlay in some cases. In this case, the coverlay cannot be disposed near the wiring end part. Therefore, in a case where the flexible printed board is particularly short, and the wiring end part and the bent position are close to each other, the wiring end part may not be protected.

On the other hand, the resist can be generally formed with high accuracy. Therefore, it is possible to narrow the gap between the wiring end part and the resist. However, the resist plastically deforms when being bent. Therefore, a reinforcing effect when the resist is repeatedly bent is inferior to the coverlay.

Along with increase in speed of a signal, the optical module product may be required to have a reduced length of the flexible printed board in view of reduction in transmission loss. As the length of the flexible printed board is reduced, the bent position comes near the root portion. This places an increased burden on the flexible printed board at bending. As described above, there is a demand for compatibly providing both disconnection prevention at bending and reduction in length of the flexible printed board.

In the present embodiment, stress is likely to concentrate on a portion indicated by a line L1 in FIGS. 1 to 4. The portion indicated by the line L1 is a portion corresponding to the end parts of the coverlays 13 and 23. In the present embodiment, the resists 12 and 22 are disposed so as to straddle the coverlays 13 and 23 and the wiring end parts 11*a* and 21*a*, respectively. In other words, the resists 12 and 22 are provided at portions of the pattern layers 11 and 21 corresponding to the end parts of the coverlays 13 and 23 where stress is likely to concentrate. Accordingly, stress concentration on the portion indicated by the line L1 can be relieved by reinforcement by the resists 12 and 22. This makes it possible to prevent disconnection of the pattern layers 11 and 21.

Further, in the present embodiment, it is unnecessary to provide a long pattern or the like at the end part in order to distribute stress. Accordingly, it is possible to reduce the length of the flexible printed board 100.

If the resist 22 is overlaid on the patterns of the wiring end part 21*a*, joining between the substrate 50 and the wiring end part 21*a* may be inhibited. However, the resist 22 can be generally formed with high accuracy. Therefore, the resist 22 can be formed among the patterns of the wiring end part 21*a* with high accuracy.

As described above, in the present embodiment, stress concentration can be relieved as a structure by providing the resists 12 and 22 for reinforcement on the wiring end parts 11*a* and 21*a*, and combining the coverlays 13 and 23 and the resists 12 and 22.

When the flexible printed board 100 is mounted on the substrate 50, for example, the flexible printed board 100 and the substrate 50 are brought into contact with each other through the joining material such as solder. Next, the joining material is melted by being heated to a melting point or more of the joining material. The substrate 50 and the pattern layer 21 are joined thereby. At this time, when the resist 22 comes into contact with the substrate 50 prior to the pattern layer 21, a gap is provided between the pattern layer 21 and the substrate 50. Therefore, in heating by a soldering iron or the like, heat may become hard to be transferred to the substrate 50. Thus, melting of the joining material on the substrate 50 may be inhibited, and mounting may become difficult.

In contrast, in the present embodiment, the resist 22 is thinner than the pattern layer 21. Likewise, the resist 12 is thinner than the pattern layer 11. In a case where each of the pattern layers 11 and 21 is formed by a rolled copper foil and Cu electroplating, for example, the rolled copper foil has a thickness of 20 μm, and the Cu electroplating has a thickness of about 10 μm. Therefore, each of the pattern layers 11 and 21 has a thickness of about 30 μm. On the other hand, each of the resists 12 and 22 formed by printing or the like has a thickness of, for example, about 15 μm. At the wiring end part 21*a*, a height of the pattern layer 21 to the base 10 is 30 μm. Further, a height of the resist 22 provided between the patterns of the wiring end part 21*a*, to the base 10 is 15 μm. As described above, the resist 22 is lower than the pattern layer 21.

Therefore, when the end part 100*b* of the flexible printed board 100 is mounted on the substrate 50, the pattern layer 21 comes into contact with the substrate 50 prior to the resist 22. Therefore, even when the resist 22 is disposed among the patterns of the wiring end part 21*a*, it is possible to suppress inhibition of mounting.

In a case where the resist is provided over the entire flexible printed board, the whole of the flexible printed board may be hardened. When the whole of the flexible printed board is hardened, the flexible printed board becomes less bendable when force is applied. Thus, large force is necessary to bend the flexible printed board. As a result, large stress is applied to the portion indicated by the line L1. Accordingly, sharp bending easily occurs at the portion indicated by the line L1, and disconnection may be likely to occur.

In contrast, in the present embodiment, the resists 12 and 22 are provided while avoiding the center portions of the pattern layers 11 and 21 in the signal propagation direction D1. Therefore, it is possible to reinforce the portion that is prone to stress concentration, while suppressing increase in stress applied to the whole of the flexible printed board 100. This makes it possible to suppress sharp bending, and to prevent disconnection.

The structure of the flexible printed board 100 is not limited to the structure illustrated in FIGS. 1 to 4. For example, a structure in which a resist and a coverlay are stacked on a pattern layer may be formed on only one of the surfaces of the base 10. In this case, on the other surface of the base 10, only one of the coverlay and the resist may cover the pattern layer.

Further, the resists 12 and 22 may be provided over the entire flexible printed board 100 depending on softness required for the flexible printed board 100. Further, the resists 12 and 22 may not be provided between the plurality of patterns of the wiring end parts 11*a* and 21*a*, respectively. The resists 12 and 22 can reinforce the portion that is prone to stress concentration as long as the resists 12 and 22 are provided from the portions of the pattern layers 11 and 21 covered with the coverlays 13 and 23 to the portions of the pattern layers 11 and 21 exposed from the coverlays 13 and 23 in a planar view. Further, shapes of the resists 12 and 22 may be different from each other.

These modifications can be applied, as appropriate, to flexible printed boards according to the following embodiments. Note that the flexible printed boards according to the following embodiments are similar to those of the first embodiment in many respects, and thus differences between the flexible printed boards according to the following embodiments and that of the first embodiment will be mainly described below.

Embodiment 2

Figure 10:
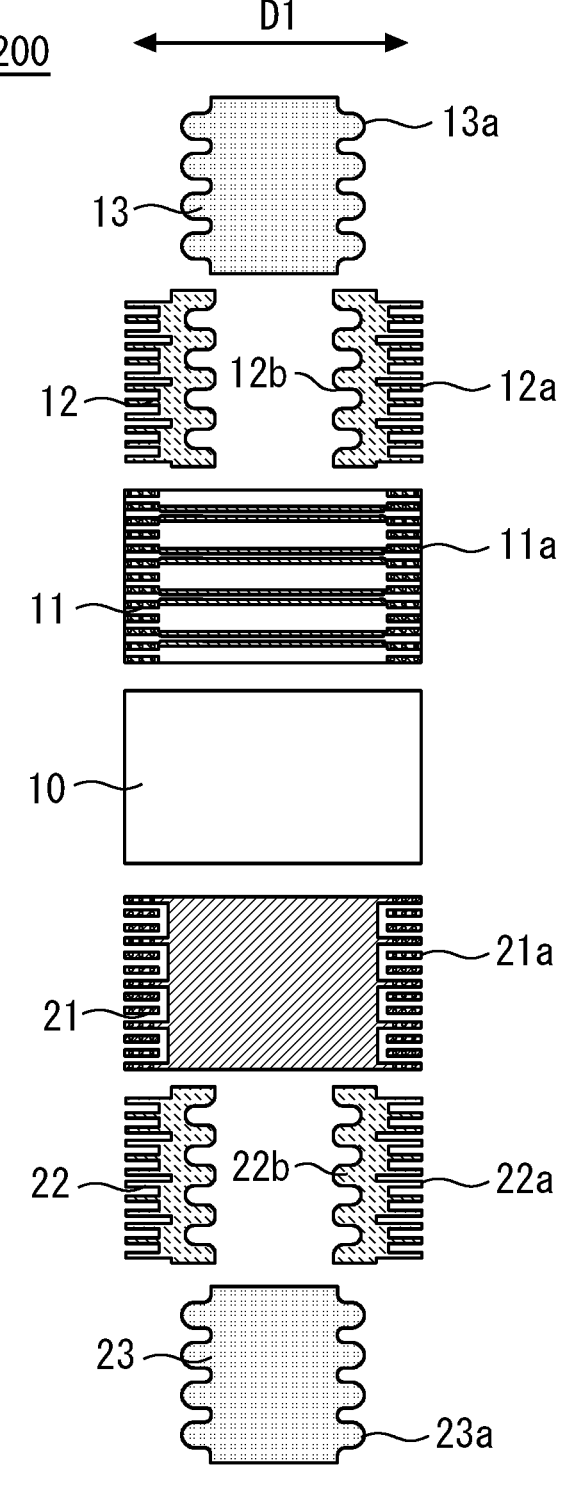
FIG. 10 is a diagram to explain a structure of a flexible printed board according to Embodiment 2.
Figure 11:
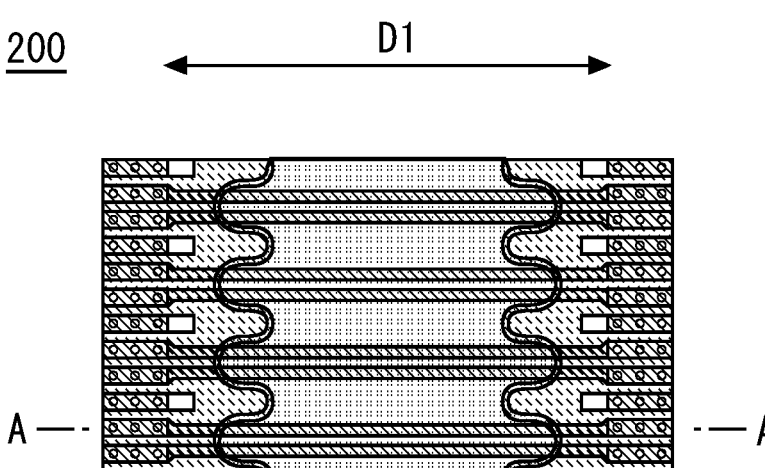
FIG. 11 is a plan view of the flexible printed board according to Embodiment 2.
Figure 12:
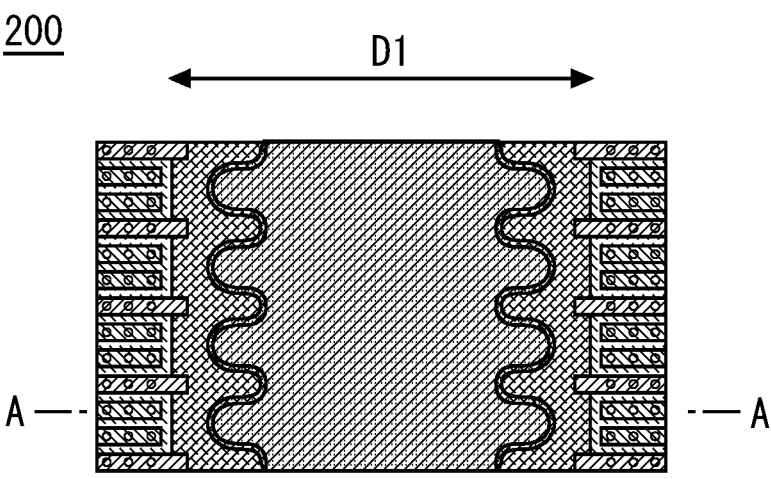
FIG. 12 is a bottom view of the flexible printed board according to Embodiment 2.
Figure 13:
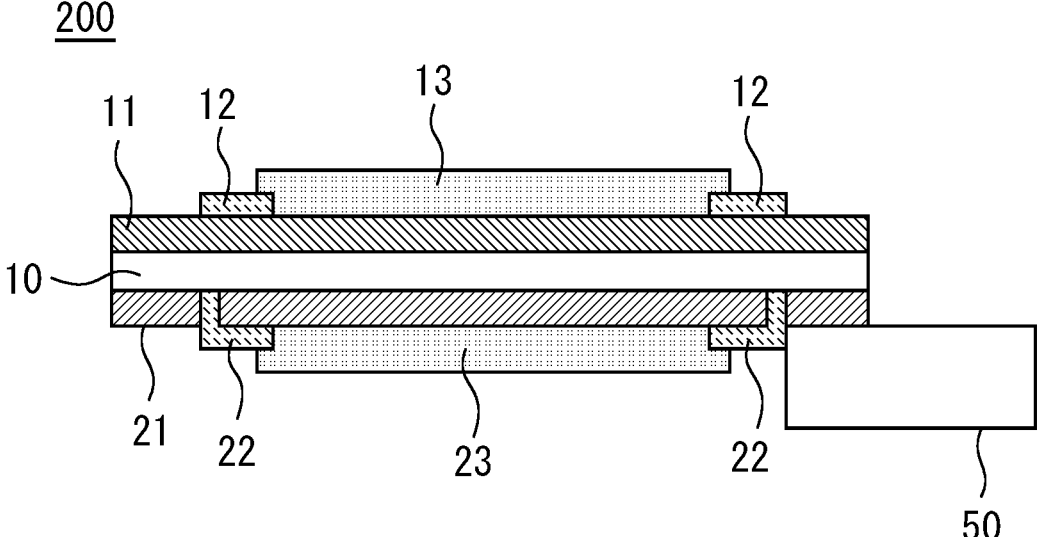
FIG. 13 is a cross-sectional view of the flexible printed board according to Embodiment 2.

FIG. 10 is a diagram to explain a structure of a flexible printed board 200 according to Embodiment 2. FIG. 11 is a plan view of the flexible printed board 200 according to Embodiment 2. FIG. 12 is a bottom view of the flexible printed board 200 according to Embodiment 2. FIG. 13 is a cross-sectional view of the flexible printed board according to Embodiment 2. FIG. 13 is a cross-sectional view taken along line A-A in FIG. 11.

In the present embodiment, end parts 13*a* and 23*a* of the coverlays 13 and 23 in the signal propagation direction D1 are each formed in a wave shape in a planar view. Further, the end parts 12*b* and 22*b* of the resists 12 and 22 on the center portion side in the signal propagation direction D1 are each formed in a wave shape in a planar view. The other configurations are similar to the configurations according to Embodiment 1. With the end parts of the coverlays 13 and 23 or the resists 12 and 22 each formed in a wave shape, it is possible to make the flexible printed board 200 more bendable as compared with Embodiment 1.

Inflexibility of the flexible printed board 200 at each position in a direction from the substrate 50 toward an end of the flexible printed board 200 relates to a cross-sectional area of each layer at each position. Inflexibility means hardness. Generally, the flexible printed board is less bendable as the cross-sectional area is larger, and the flexible printed board is easily bent as the cross-sectional area is smaller. At this time, an expression of force=deformation amount×elastic modulus is established. Being less bendable, namely, being hard means that elastic modulus is high. Likewise, being bendable, namely, being soft means that elastic modulus is low.

Occurrence of tight bending means that a deformation amount is rapidly increased/decreased before and after a certain portion. Since deformation amount=force/elastic modulus is established, in a case of fixed force, the deformation amount rapidly changes before and after a portion where hardness is rapidly changed. In a case where a boundary of hardness is present, for example, in a case where hardness is high on a front side of a certain portion and hardness is rapidly reduced on a rear side of the certain portion in a direction from a root to a front end, the deformation amount is rapidly changed. At this time, tight bending is added, and disconnection may likely to occur.

In other words, in the flexible printed board, disconnection is likely to occur at a portion where the cross-sectional area of each layer is rapidly changed. In contrast, in the present embodiment, the end parts of the resists and the coverlays are each formed in a shape. As a result, the change in cross-sectional area in the signal propagation direction D1 can be made gentle. This makes it possible to mitigate the bent shape of the flexible printed board 200, and to prevent disconnection.

Figure 14:
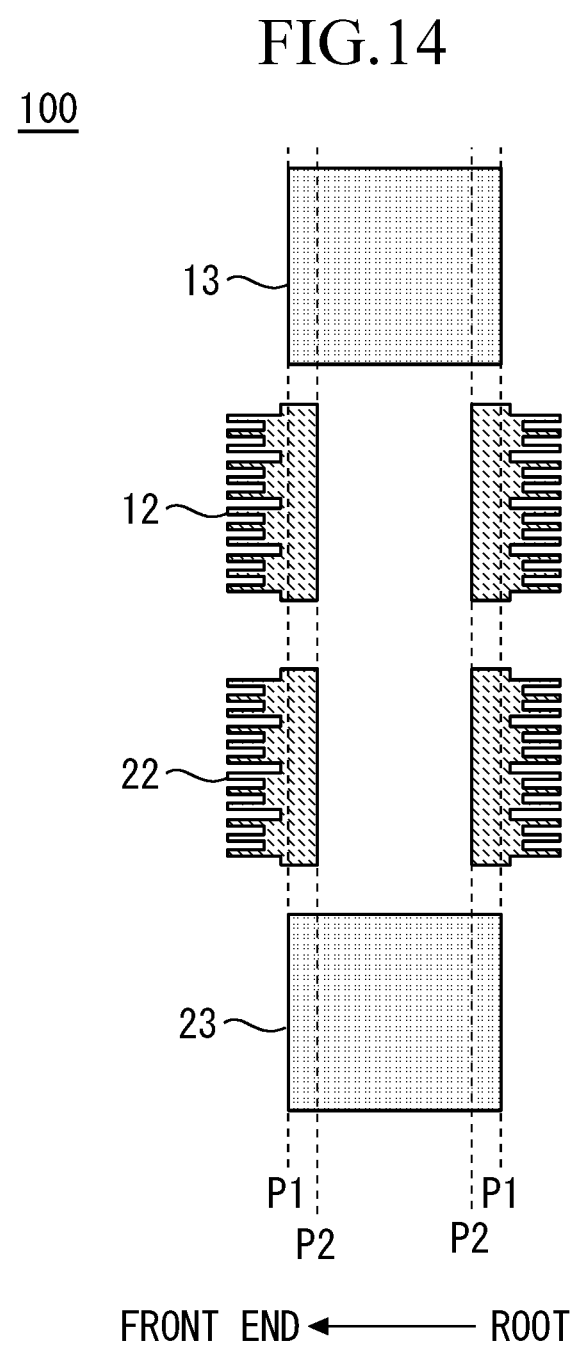

FIG. 14 is a diagram to explain portions as boundaries of the members of the flexible printed board 100 according to embodiment 1. In FIG. 14, positions P1 correspond to the end parts of the coverlays 13 and 23, and positions P2 correspond to the end parts of the resists 12 and 22. As described above, in Embodiment 1, each of the layers has a linear boundary. Accordingly, the cross-sectional area of each of the layers is rapidly changed before and behind each of the positions P1 and P2 in the direction from the root toward the front end. Thus, when the flexible printed board 100 is bent by large force in a peeling-off direction, tight bending may be added.

Figure 15:
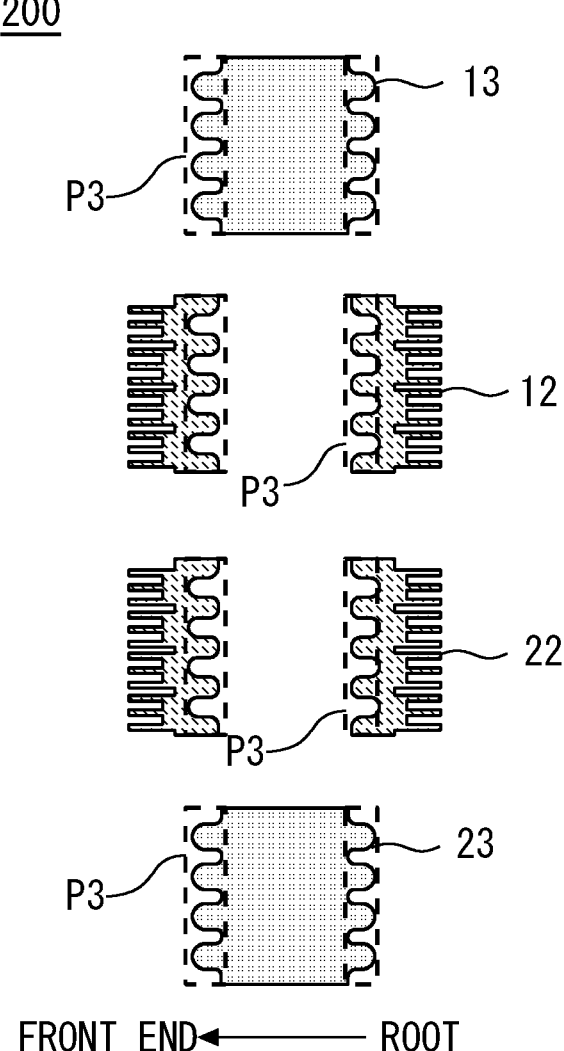
FIG. 15 is a diagram to explain portions as boundaries of the members of the flexible printed board according to Embodiment 2.

FIG. 15 is a diagram to explain portions as boundaries of the members of the flexible printed board 200 according to Embodiment 2. The end parts of the coverlays 13 and 23 and the end parts of the resists 12 and 22 are provided within ranges indicated by frames P3. Therefore, the cross-sectional area of each of the layers is gently changed within the ranges indicated by the frames P3. Thus, when the flexible printed board 200 is bent, the bent shape is mitigated. This makes it possible to relieve stress concentration on the bent portion, and to prevent disconnection.

Each of the resists 12 and 22 and the coverlays 13 and 23 has manufacturing tolerance. For example, the manufacturing tolerance of each of the resists 12 and 22 is ±0.05 mm, and the manufacturing tolerance of each of the coverlays 13 and 23 is ±0.3 mm. In this case, a width of a portion where the resist and the coverlay overlap with each other is set to 0.05±0.3=0.35 mm, no gap is generated between the resist and the coverlay. This makes it possible to prevent the pattern layers 11 and 21 from being exposed to outside air. Further, it is possible to prevent a short circuit between the patterns caused by adhesion of foreign substances. Furthermore, it is possible to prevent a locally soft portion from being formed due to non-overlapping of the resist and the coverlay. Accordingly, it is possible to avoid stress concentration, and to maintain disconnection resistance.

On the other hand, when an area of the portion where the resist and the coverlay overlap with each other is increased, the flexible printed board may become less bendable. As a result, stress may concentrate on a boundary between a portion that is easily bent and a portion that is less bendable, and disconnection may be likely to occur. Therefore, the portion where the resist and the coverlay overlap with each other preferably has a minimum necessary width.

In contrast, in the present embodiment, as illustrated in FIGS. 10 to 12, the end parts 12b and 22b of the resists 12 and 22 are provided along the end parts 13a and 23a of the coverlays 13 and 23, respectively. In other words, the end parts 12b and 22b of the resists 12 and 22 are formed in shapes depending on the end parts 13a and 23a of the coverlays 13 and 23. This makes it possible to cause the portion where the resist and the coverlay overlap with each other to have a minimum necessary width while preventing a gap between the resist and the coverlay from being formed.

In the flexible printed board 200, the portion where the coverlay and the resist overlap with each other is the hardest. A configuration in which the portion is gently bent is important as disconnection countermeasures. In a case where the flexible printed board 200 is bent as illustrated in FIGS. 7 to 9, the flexible printed board 200 is more bendable when the wave-shaped portions of the resists 12 and 22 and the coverlays 13 and 23 are longer in the signal propagation direction D1. In contrast, when the wave-shaped portions are excessively long, the area of the portion where the resist and the coverlay overlap with each other is increased. As a result, the flexible printed board is hardened, stress with bending is increased, and disconnection may be likely to occur. Accordingly, the lengths of the wave-shaped portions in the signal propagation direction D1 are preferably adequately adjusted.

The portion where the resist and the coverlay overlap with each other is hard. Therefore, stress is likely to concentrate on portions before and behind that portion. Thus, in the present embodiment, adjustment of the shapes of the wave-shaped portions of the resists 12 and 22 and the coverlays 13 and 23 makes it possible to control a bent portion at a certain degree. It is assumed that each of the pattern layers 11 and 21 includes a portion where disconnection is likely to occur, for example, a portion with a fine pattern shape. At this time, the portion where disconnection is likely to occur and the portion where the resist and the coverlay overlap with each other may be overlaid. When the portion where disconnection is likely to occur and the hard portion are overlaid, disconnection can be prevented. As described above, in the present embodiment, it is possible to take the disconnection countermeasures corresponding to the shapes of the pattern layers 11 and 21.

As a modification of the present embodiment, the end parts 12b and 22b of the resists 12 and 22 may not be provided along the end parts 13a and 23a of the coverlays 13 and 23. For example, the end parts of the coverlays 13 and 23 or the resists 12 and 22 may be each formed in a wave shape. Further, the end parts of the coverlay 13 or 23 may be each formed in a wave shape. Further, the end parts of the resist 12 or 22 may be each formed in a wave shape.

Further, in the present embodiment, the wave-shaped end part 13a of the coverlay 13 and the wave-shaped end part 23a of the coverlay 23 overlap with each other in a planar view. The shapes of the end parts 13a and 23a are not limited thereto, and the end parts 13a and 23a may be formed in shapes different from each other. Further, in the present embodiment, the wave-shaped end part 12b of the resist 12 and the wave-shaped end part 22b of the resist 22 overlap with each other in a planar view. The shape of the end parts 12b and 22b are not limited thereto, and the end parts 12b and 22b may be formed in shapes different from each other.

Embodiment 3

Figure 16:
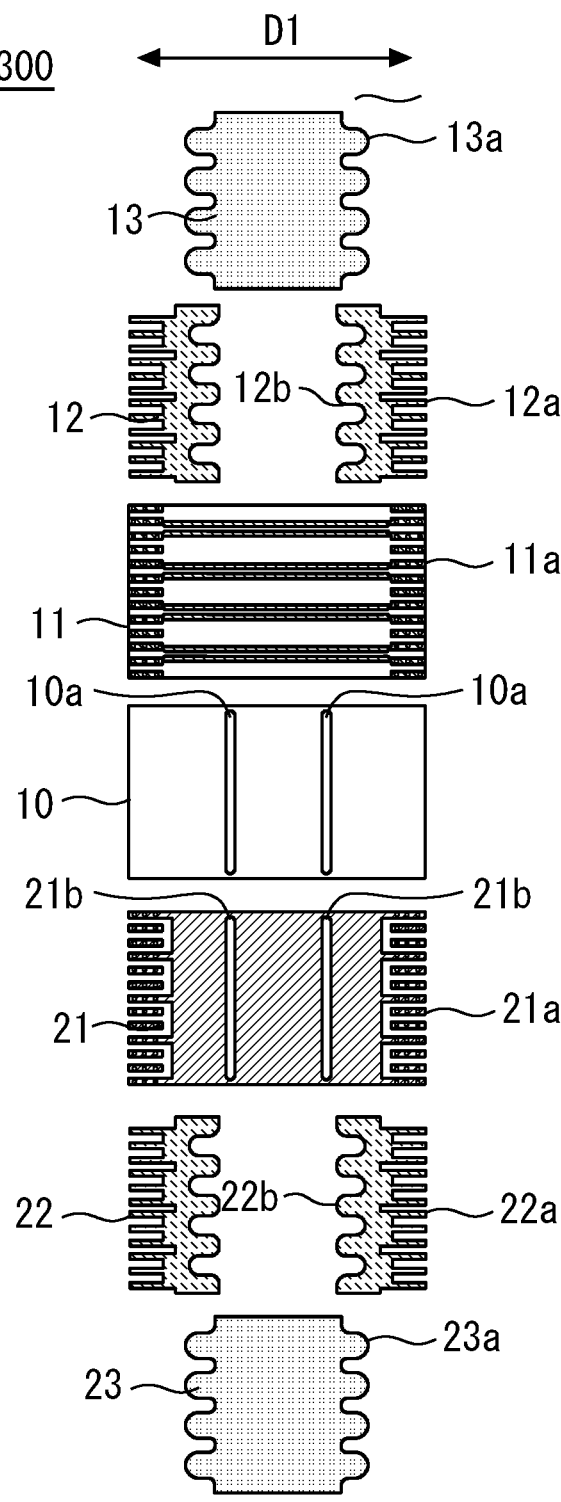
FIG. 16 is a diagram to explain a structure of a flexible printed board according to Embodiment 3.
Figure 17:
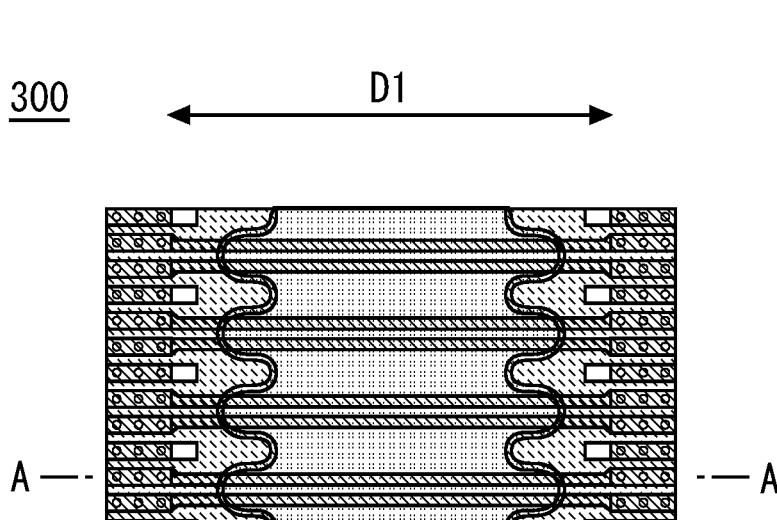
FIG. 17 is a plan view of the flexible printed board according to Embodiment 3.
Figure 18:
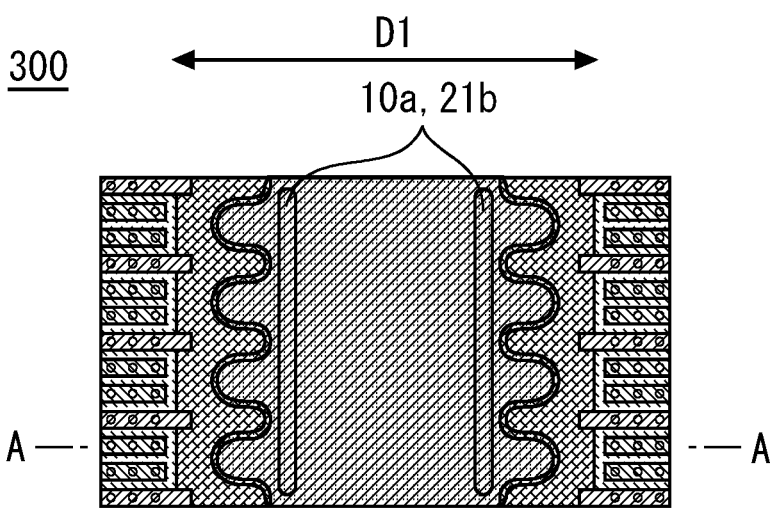
FIG. 18 is a bottom view of the flexible printed board according to Embodiment 3.
Figure 19:
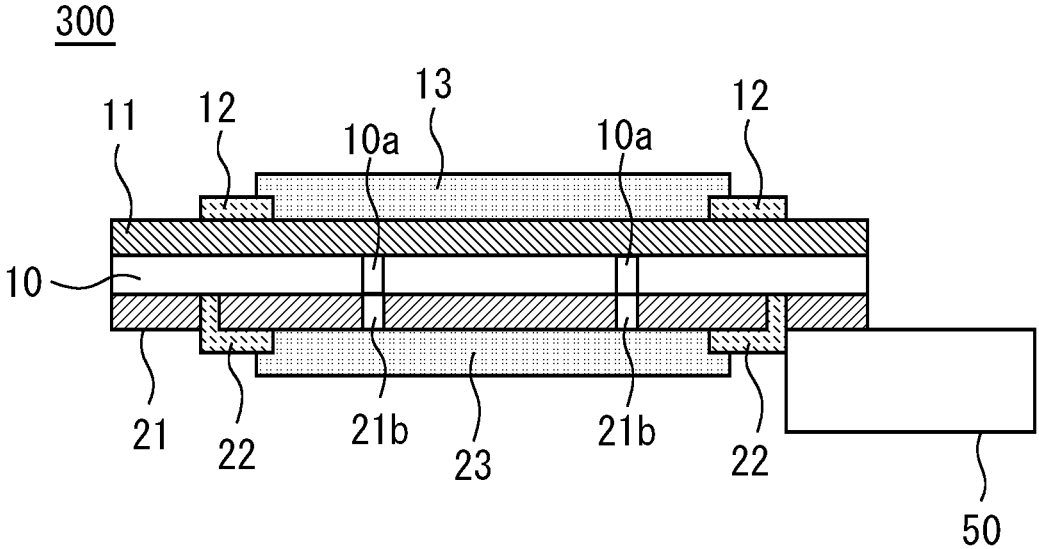
FIG. 19 is a cross-sectional view of the flexible printed board according to Embodiment 3.

FIG. 16 is a diagram to explain a structure of a flexible printed board 300 according to Embodiment 3. FIG. 17 is a plan view of the flexible printed board 300 according to Embodiment 3. FIG. 18 is a bottom view of the flexible printed board 300 according to Embodiment 3. FIG. 19 is a cross-sectional view of the flexible printed board 300 according to Embodiment 3. FIG. 19 is a cross-sectional view taken along line A-A in FIG. 17. In the present embodiment, openings 21b are provided at portions other than the wiring end part 21a of the pattern layer 21. Further, openings 10a are provided in the base 10. The other configurations are similar to the configurations according to Embodiment 2.

The openings 21b are provided, for example, near the end parts 22b and 23a. The openings 21b may be provided at a center portion of the pattern layer 21. Further, the openings 10a of the base 10 and the openings 21b of the pattern layer 21 may overlap with each other in a planar view.

Forming a clipping in the pattern layer 21 makes a portion with the clipping bendable. This makes it possible to keep a portion bent when the flexible printed board 300 is bent, away from the root portion of the substrate 50. As a result, the bent shape of the flexible printed board 300 can be further mitigated. This makes it possible to relieve stress concentration on the bent portion, and to prevent disconnection.

It is necessary for the pattern layer 21 to maintain electric conduction from one end to the other end in the signal propagation direction D1 because the flexible printed board 300 has a function of transmitting an electric signal. The pattern layer 21 is made of a metal material such as copper. Forming the openings 21b in the pattern layer 21 makes it possible to reduce a cross-sectional area of a metal portion, and to soften the metal portion. Further, since the openings 21b are provided while avoiding the end parts of the pattern layer 21, it is possible to maintain electric conduction of the flexible printed board 300.

Further, since the openings 10a are formed in the base 10, it is possible to further relieve stress concentration on the bent portion, and to prevent disconnection.

As described above, tight bending easily occurs at the portion where the hardness is rapidly changed. In the present embodiment, even if tight bending occurs at the portions corresponding to the openings 21b, the coverlays 13 and 23 and the resists 12 and 22 are provided on and under the pattern layers 11 and 21. This makes it possible to protect the pattern layers 11 and 21, and to prevent disconnection.

In the present embodiment, as the openings 21b, two long holes are provided near the end part 23a of the coverlay 23. The number and the arrangement of openings 21b are not limited thereto. It is sufficient to form the openings 21*b* at positions overlapping with the coverlays 13 and 23 or the resists 12 and 22 in a planar view. Further, one or three or more openings 21*b* may be provided. For example, four long holes may be provided. Further, the long holes illustrated in FIG. 16 may be connected to form one large opening 21*b*. The openings 10*a* of the base 10 may not be provided.

Embodiment 4

Figure 20:
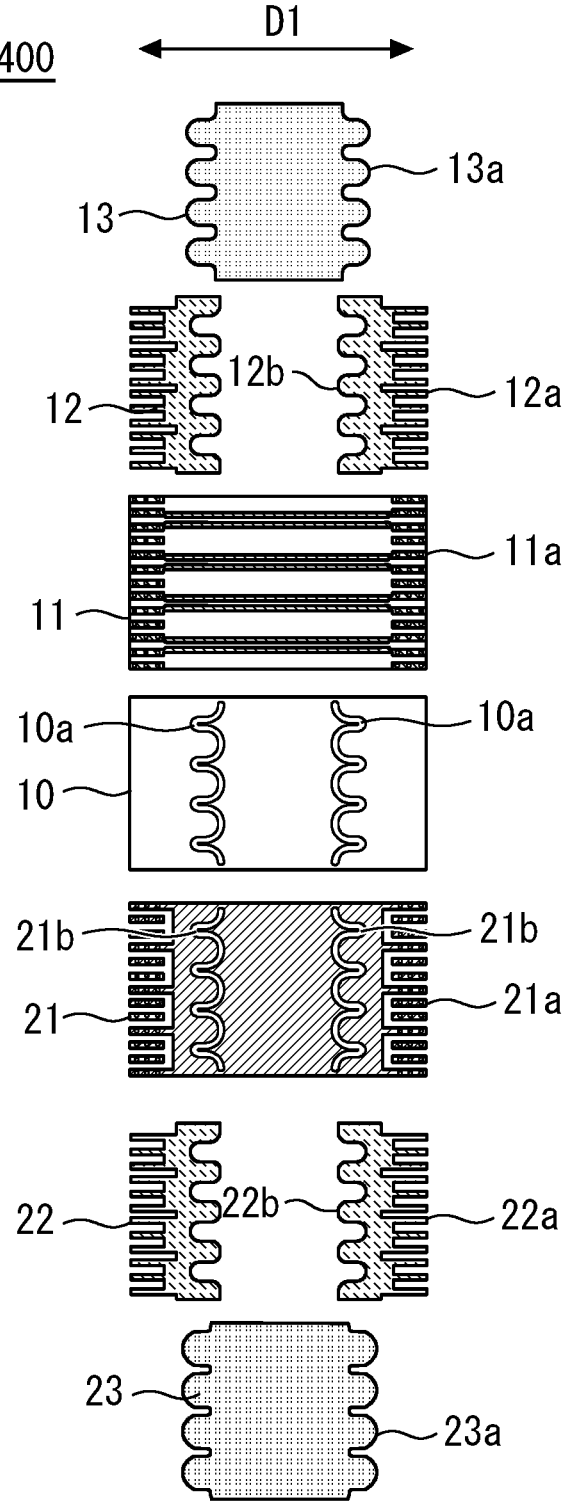
FIG. 20 is a diagram to explain a structure of a flexible printed board according to Embodiment 4.
Figures 21, 22:
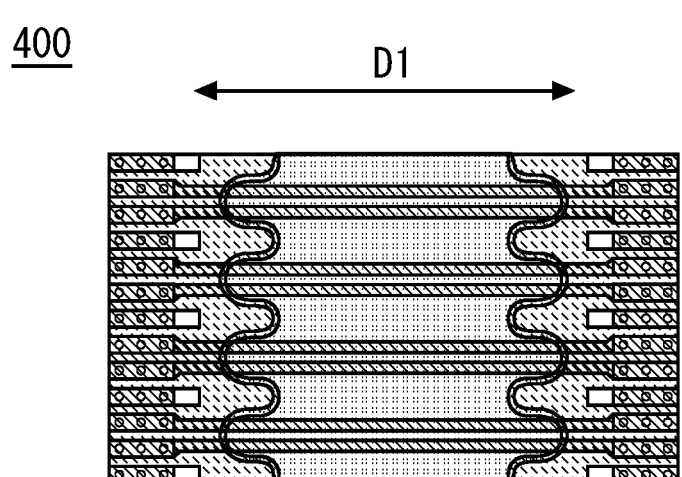
FIG. 21 is a plan view of the flexible printed board according to Embodiment 4.
FIG. 22 is a bottom view of the flexible printed board according to Embodiment 4.
Figure 23:
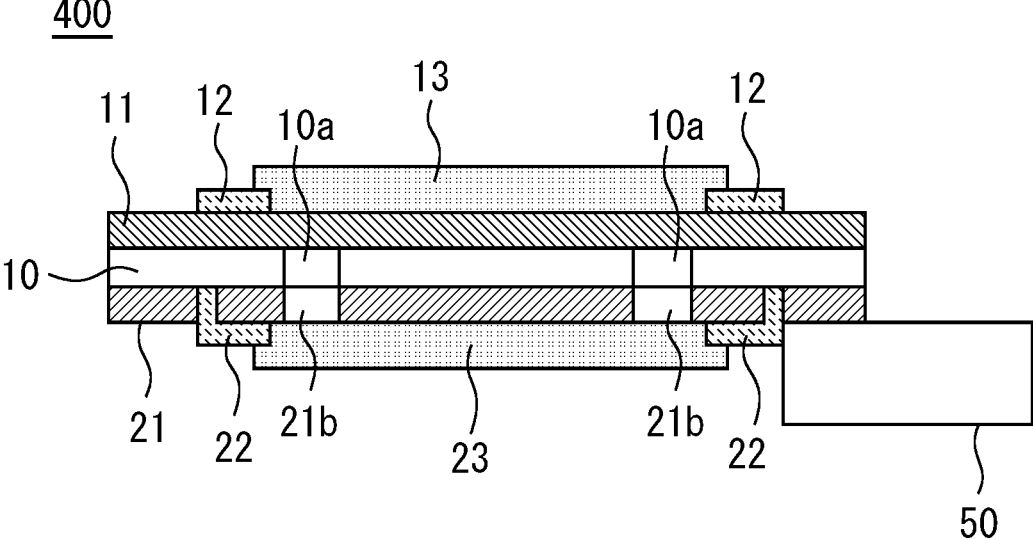
FIG. 23 is a cross-sectional view of the flexible printed board according to Embodiment 4.

FIG. 20 is a diagram to explain a structure of a flexible printed board 400 according to Embodiment 4. FIG. 21 is a plan view of the flexible printed board 400 according to Embodiment 4. FIG. 22 is a bottom view of the flexible printed board 400 according to Embodiment 4. FIG. 23 is a cross-sectional view of the flexible printed board 400 according to Embodiment 4. FIG. 23 is a cross-sectional view taken along line A-A in FIG. 22. In the present embodiment, the openings 21*b* of the pattern layer 21 are each formed in a wave shape in a planar view. The openings 10*a* of the base 10 are each formed in a wave shape in a planar view. The other configurations are similar to the configurations according to Embodiment 3. The openings 10*a* of the base 10 and the openings 21*b* of the pattern layer 21 may overlap with each other in a planar view.

Therefore, portions where the openings 21*b* of the pattern layer 21 are formed easily bent. Further, when each of the openings 21*b* is formed in the wave shape, the bent shape is further mitigated. Accordingly, stress concentration on the bent portion when force is applied to the flexible printed board 400 is relieved, and disconnection can be prevented.

Figure 24:
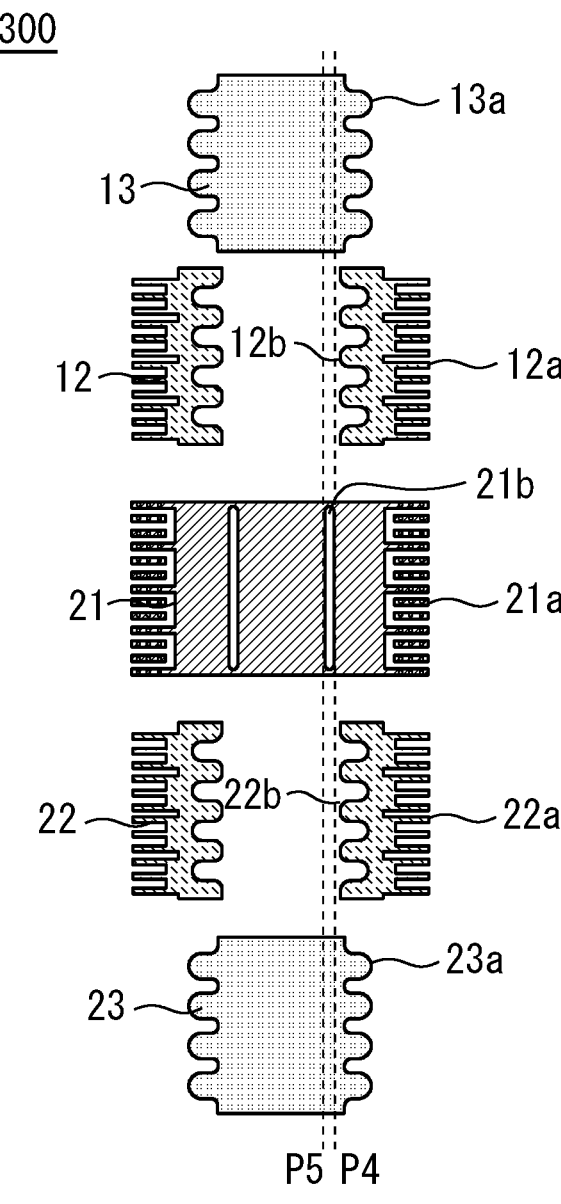
FIG. 24 is a diagram to explain a portion where a cross-sectional area is changed in the pattern layer according to Embodiment 3.
Figure 25:
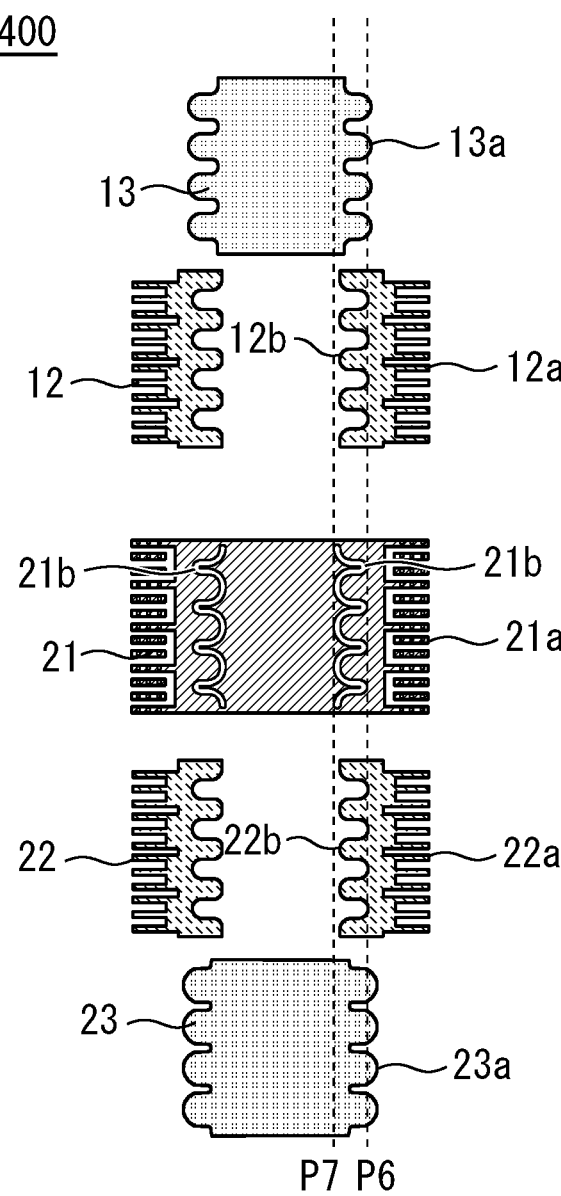
FIG. 25 is a diagram to explain a portion where a cross-sectional area is changed in the pattern layer according to Embodiment 4.

FIG. 24 is a diagram to explain a portion where a cross-sectional area is changed in the pattern layer 21 according to Embodiment 3. FIG. 25 is a diagram to explain a portion where a cross-sectional area is changed in the pattern layer 21 according to Embodiment 4. In the pattern layer 21 according to Embodiment 3 illustrated in FIG. 24, the cross-sectional area is changed at positions P4 and P5. Therefore, tight bending easily occurs at the positions P4 and P5.

On the other hand, in the pattern layer 21 according to Embodiment 4 illustrated in FIG. 25, the cross-sectional area is gently changed within a range from a position P6 to a position P7. Therefore, it is possible to mitigate the bent shape, and to prevent disconnection.

In the example illustrated in FIGS. 20 to 22, the openings 21*b* are provided along the end part 13*a* of the coverlay 13 or the end part 23*a* of the coverlay 23. As described above, the portion where the coverlay and the resist overlap with each other is likely to be hardened. When the openings 21*b* for softening the flexible printed board 400 are formed along the portion that is likely to be hardened, it is possible to nearly uniformize the hardness of the flexible printed board 400. As a result, it is possible to mitigate bending R when the flexible printed board 400 is bent, and to prevent stress concentration and disconnection.

For example, in a case where manufacturing tolerance of the coverlay is ±0.2 mm, and processing accuracy of each of the openings 21*b* is ±0.1 mm, a gap of 0.2+0.1=0.3 mm at minimum is preferably provided between the coverlay and each of the openings 21*b*. As a result, the openings 21*b* do not protrude from the coverlay in a planar view, and a function of protecting the pattern layer by the coverlay can be secured. In a case where the openings 21*b* protrude from the coverlay, foreign substances may be adhered to the pattern layer, and a failure such as a short circuit between patterns may occur. Further, when the flexible printed board is bent in the state where the openings 21*b* protrude from the coverlay, force in the peeling-off direction may be applied to the end parts of the coverlay overlapping with the openings 21*b*. Therefore, the coverlay may be peeled off.

In contrast, in a case where the gap between the coverlay and each of the openings 21*b* is increased, the portions of the openings 21*b* along the wave-shaped end parts of the coverlay cannot be sufficiently secured. At this time, each of the openings 21*b* may be formed not on a wave shape but in a shape in which a straight line includes thorns. In this case, as in the case where the linear openings are formed in the pattern layer 21, stress may concentrate on the openings and sharp bending may occur when the flexible printed board 400 is bent. Therefore, the gap between the coverlay and each of the openings 21*b* is preferably adequately adjusted.

As described above, in a case where the flexible printed board 400 is bent as illustrated in FIGS. 7 to 9, the flexible printed board 400 is more bendable when the wave-shaped portions of the resists and the coverlays are longer in the signal propagation direction D1. The gap between the coverlay and each of the openings 21*b* is adequately secured while such wave-shaped portions are secured, which makes it possible to uniformly bend the flexible printed board 400, and to achieve an effect of preventing stress concentration and disconnection.

The manufacturing tolerance of each of the resists, the coverlays, and the openings is generally defined. In the present embodiment, the resists, the coverlays, and the openings are formed such that the end parts of the resists, the end parts of the coverlays, and the openings extend along each other. Accordingly, it is possible to minimize the width of the portion where the resist and the coverlay overlap with each other and the gap between the coverlay and each of the openings based on the manufacturing tolerance. In other words, it is possible to facilitate design to suppress sharp bending while securing a function of protecting the pattern layers.

As a modification of the present embodiment, the openings 21*b* may be provided along the end parts of the resist 12 or the resist 22 in a planar view. It is sufficient to form the openings 21*b* along any of the end parts 13*a*, 23*a*, 12*b*, and 22*b* in a planar view. Further, the openings 21*b* may not be provided along the end parts 13*a*, 23*a*, 12*b*, and 22*b*. Further, the two openings 21*b* may be connected to form one hole.

Embodiment 5

Figure 26:
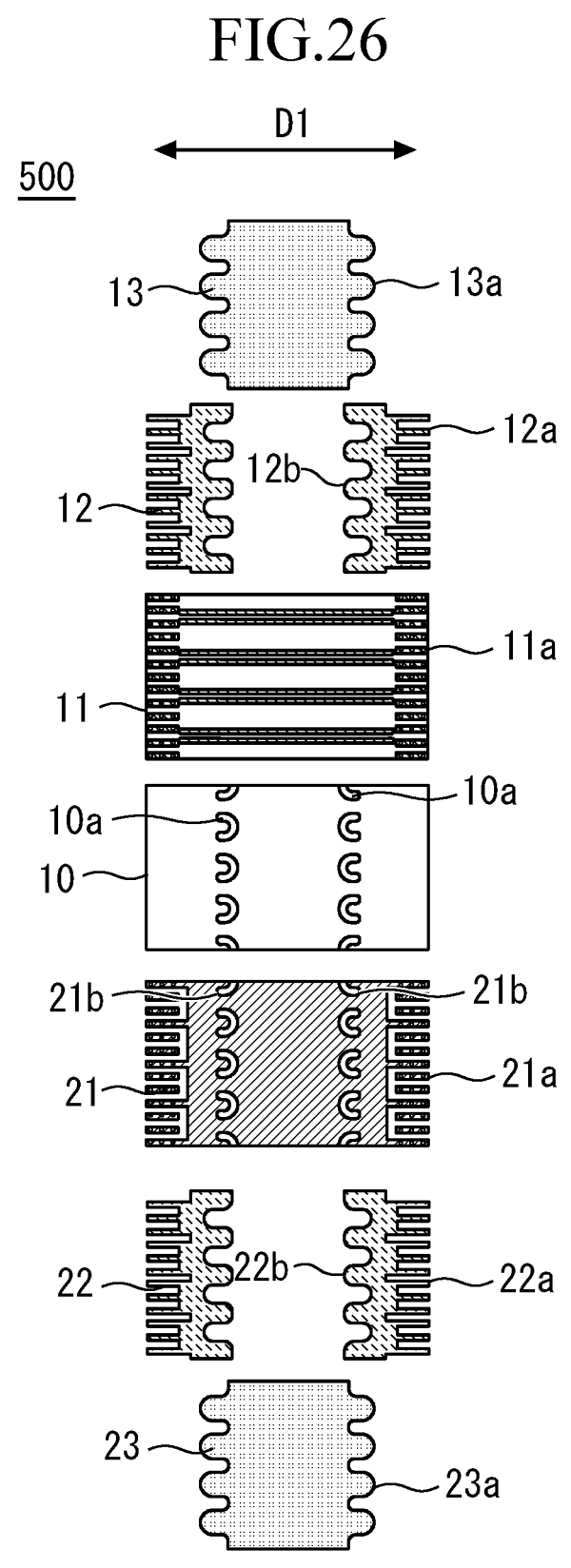
Figure 27:
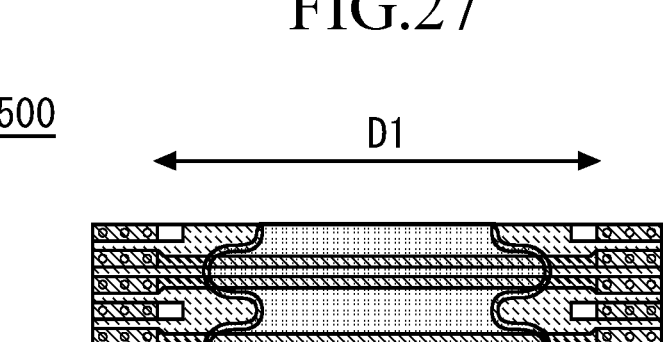
FIG. 27 is a plan view of the flexible printed board according to Embodiment 5.
Figure 28:
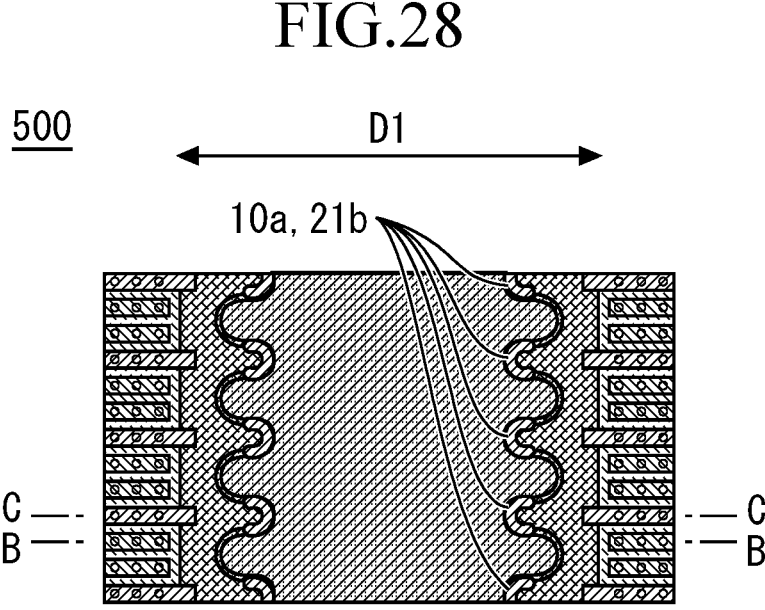
FIG. 28 is a bottom view of the flexible printed board according to Embodiment 5.
Figure 29:
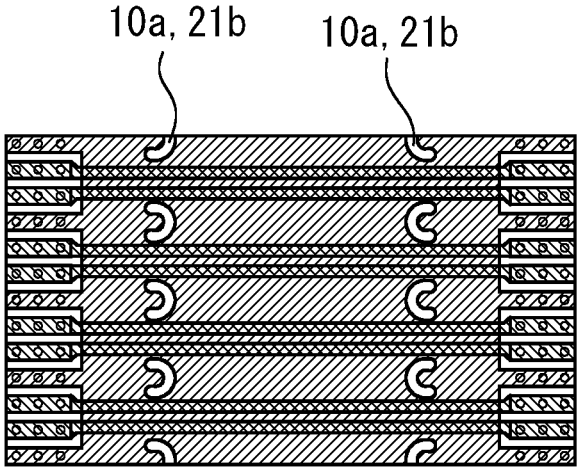
FIG. 29 is a diagram illustrating a state where the pattern layers are overlaid according to Embodiment 5.

FIG. 26 is a diagram to explain a structure of a flexible printed board 500 according to Embodiment 5. FIG. 27 is a plan view of the flexible printed board 500 according to Embodiment 5. FIG. 28 is a bottom view of the flexible printed board 500 according to Embodiment 5. FIG. 29 is a diagram illustrating a state where the pattern layers 11 and 21 are overlaid according to Embodiment 5. In the present embodiment, the shapes of the openings 21*b* and 10*a* are different from the shapes of the openings 21*b* and 10*a* according to Embodiment 4. The other configurations are similar to the configurations according to Embodiment 4.

The openings 21*b* are provided along the end part 23*a* of the coverlays 23 and the end part 22*b* of the resist 22 in a planar view. Further, the openings 21*b* are provided while avoiding portions of the pattern layer 21 overlapping with the pattern layer 11 in a planar view. The openings 10*a* of the base 10 and the openings 21*b* of the pattern layer 21 may overlap with each other in a planar view.

Figure 30:
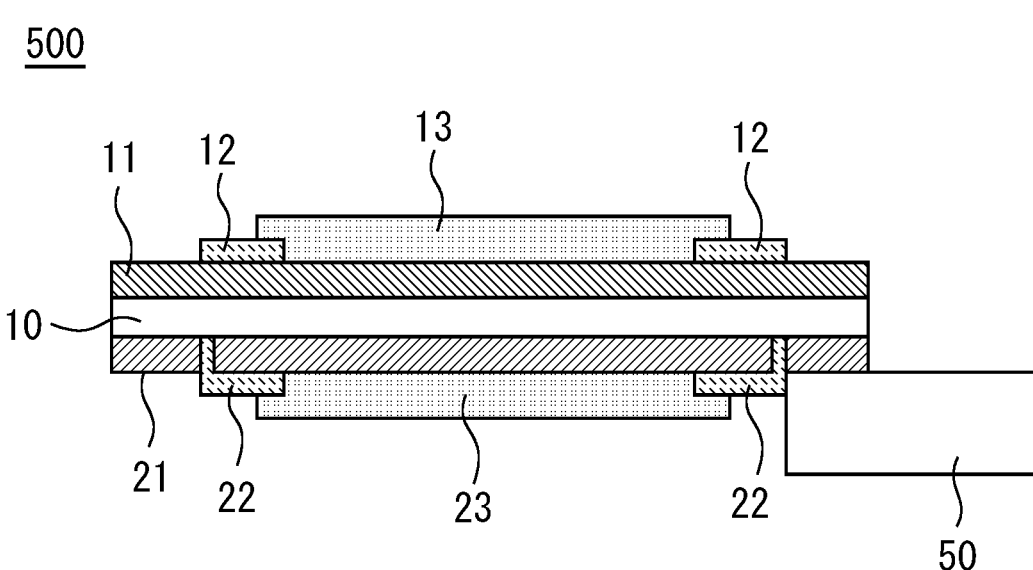
FIG. 30 is a cross-sectional view taken along line B-B in FIG. 28.
Figure 31:
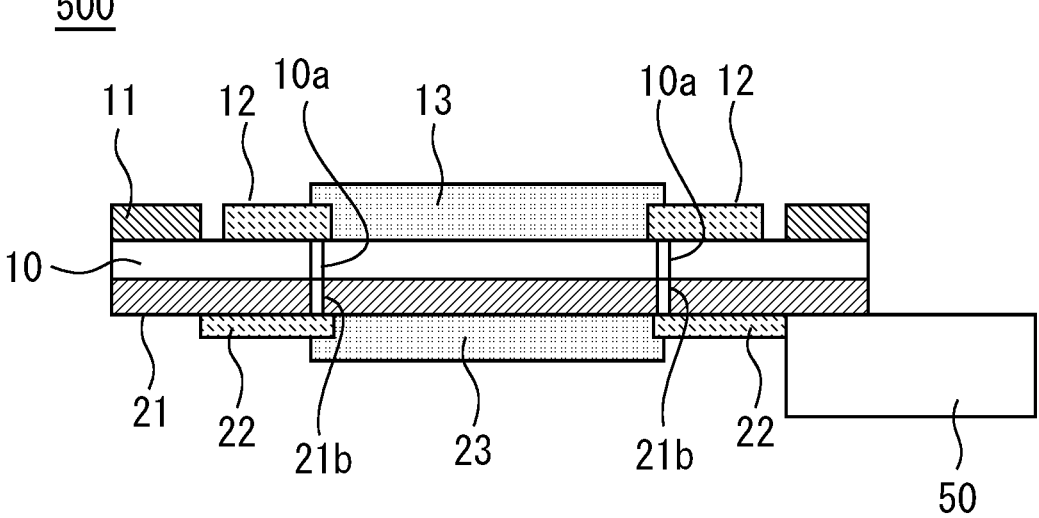
FIG. 31 is a cross-sectional view taken along line C-C in FIG. 28.

FIG. 30 is a cross-sectional view taken along line B-B in FIG. 28. FIG. 31 is a cross-sectional view taken along line C-C in FIG. 28. In the present embodiment, the openings 21*b* of the pattern layer 21 are small as compared with Embodiment 4. Therefore, an effect of mitigating bending of the flexible printed board 500 is inferior to Embodiment 4. In contrast, deterioration of a high-frequency signal propagating through the pattern layer 11 can be suppressed because an electrode portion of the pattern layer 21 is present just below the pattern layer 11. Accordingly, it is possible to prevent disconnection while securing high-frequency characteristics.

In FIG. 26, the openings 21*b* are arranged in two lines so as to be adjacent to the opposite end parts 23*a* of the coverlay 23. The arrangement is not limited thereto, and the openings 21*b* may be arranged in three or more lines. The openings 21*b* may be provided so as to overlap with the end part 22*b* of the resist 22. It is sufficient to form the openings 21*b* along any of the end parts 13*a*, 23*a*, 12*b*, and 22*b*. Further, the openings 21*b* may not be formed along the end parts 13*a*, 23*a*, 12*b*, and 22*b*. Further, the openings 21*b* on both sides in the signal propagation direction D1 may be connected to form a large opening 21*b*.

The technical features described in the embodiments may be appropriately combined.

REFERENCE SIGNS LIST 10 base, 10*a* opening, 11 pattern layer, 11*a* wiring end part, 12 resist, 12*a*, 12*b* end part, 13 coverlay, 13*a* end part, 21 pattern layer, 21*a* wiring end part, 21*b* opening, 22 resist, 22*a*, 22*b* end part, 23 coverlay, 23*a* end part, 50 substrate, 52 package, 54 optical communication device, 54*a* laser diode, 54*b* photodiode, 56 receptacle, 58 optical connector, 60 optical fiber, 62 transmission substrate, 100 flexible printed board, 100*a* deformation portion, 100*b*, 100*c* end part, 100*d* root portion, 101 optical communication module, 200, 300, 400, 500 flexible printed board

The invention claimed is:

1. A flexible printed board, comprising:
a first pattern layer including, at an end part thereof, a wiring end part to be connected to a substrate; and
a resist and a coverlay overlaid on the first pattern layer, wherein
the coverlay covers an inside of the wiring end part of the first pattern layer in a planar view,
the resist is provided from a portion of the first pattern layer covered with the coverlay to a portion of the first pattern layer exposed from the coverlay, in a planar view,
an end part of the coverlay in a signal propagation direction has a wave shape in a planar view,
a center portion of the first pattern layer in the signal propagation direction is exposed from the resist in a planar view,
an end part of the resist on the center portion side has a wave shape in a planar view, and is provided along the end part of the coverlay, and
the end part of the coverlay having the wave shape faces an opposite direction from the end part of the resist having the wave shape.

2. The flexible printed board according to claim 1, wherein
the wiring end part includes a plurality of patterns, and
the resist is provided between the plurality of patterns.

3. The flexible printed board according to claim 2, wherein the resist is thinner than the first pattern layer.

4. The flexible printed board according to claim 1, wherein an opening is provided at a portion other than the wiring end part of the first pattern layer.

5. The flexible printed board according to claim 4, further comprising:
a base provided with the first pattern layer on a first surface; and
a second pattern layer provided on a second surface on a side opposite to the first surface of the base, wherein
the opening is provided while avoiding a portion of the first pattern layer overlapping with the second pattern layer in a planar view.

6. The flexible printed board according to claim 1, wherein
an opening is provided at a portion other than the wiring end part of the first pattern layer, and
the opening is provided along the end part of the coverlay and the end part of the resist in a planar view.

7. A flexible printed board, comprising:
a first pattern layer including, at an end part thereof, a wiring end part to be connected to a substrate; and
a resist and a coverlay overlaid on the first pattern layer in a vertical direction, wherein
the coverlay covers an inside of the wiring end part of the first pattern layer in a planar view,
the resist is provided from a portion of the first pattern layer covered with the coverlay to a portion of the first pattern layer exposed from the coverlay, in a planar view,
an opening is provided in the first pattern layer at a portion other than the wiring end part of the first pattern layer, the opening extending all the way through the first pattern layer in the vertical direction, and
the opening has a wave shape in a planar view.

8. A flexible printed board, comprising:
a first pattern layer including, at an end part thereof, a wiring end part to be connected to a substrate; and
a resist and a coverlay overlaid on the first pattern layer in a vertical direction, wherein
the coverlay covers an inside of the wiring end part of the first pattern layer in a planar view,
the resist is provided from a portion of the first pattern layer covered with the coverlay to a portion of the first pattern layer exposed from the coverlay, in a planar view,
an end part of the coverlay in a signal propagation direction has a wave shape in a planar view,
an opening is provided in the first pattern layer at a portion other than the wiring end part of the first pattern layer, the opening extending all the way through the first pattern layer in the vertical direction, and
the opening is provided along the end part of the coverlay in a planar view.

9. A flexible printed board, comprising:
a first pattern layer including, at an end part thereof, a wiring end part to be connected to a substrate; and
a resist and a coverlay overlaid on the first pattern layer in a vertical direction, wherein
the coverlay covers an inside of the wiring end part of the first pattern layer in a planar view,
the resist is provided from a portion of the first pattern layer covered with the coverlay to a portion of the first pattern layer exposed from the coverlay, in a planar view,
a center portion of the first pattern layer in a signal propagation direction is exposed from the resist in a planar view, an end part of the resist on the center portion side has a
  wave shape in a planar view, an opening is provided in the first pattern layer at a portion
  other than the wiring end part of the first pattern layer,
  the opening extending all the way through the first
  pattern layer in the vertical direction, and the opening is provided along the end part of the resist in
  a planar view.

*    *    *    *    *